(12) United States Patent
Findeklee et al.

(10) Patent No.: US 10,274,555 B2
(45) Date of Patent: Apr. 30, 2019

(54) MAGNETIC RESONANCE IMAGING RF ANTENNA

(71) Applicant: KONINKLIJKE PHILIPS N.V., Eindhoven (NL)

(72) Inventors: Christian Findeklee, Eindhoven (NL); Christoph Leussler, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 16 days.

(21) Appl. No.: 15/127,859

(22) PCT Filed: Feb. 27, 2015

(86) PCT No.: PCT/EP2015/054194
§ 371 (c)(1),
(2) Date: Sep. 21, 2016

(87) PCT Pub. No.: WO2015/144388
PCT Pub. Date: Oct. 1, 2015

(65) Prior Publication Data
US 2017/0089989 A1    Mar. 30, 2017

(30) Foreign Application Priority Data
Mar. 24, 2014 (EP) .................. 14161217

(51) Int. Cl.
*G01R 33/34* (2006.01)
*G01R 33/3415* (2006.01)
(Continued)

(52) U.S. Cl.
CPC .... *G01R 33/34007* (2013.01); *G01R 33/3415* (2013.01); *G01R 33/34076* (2013.01); *G01R 33/3635* (2013.01); *G01R 33/422* (2013.01)

(58) Field of Classification Search
CPC ......... F16K 31/53; F16H 35/00; F16H 55/084
See application file for complete search history.

(56) References Cited

U.S. PATENT DOCUMENTS 4,833,409 A    5/1989  Eash
6,420,871 B1   7/2002  Wong
(Continued)

FOREIGN PATENT DOCUMENTS

GB    2151791 A    7/1985

OTHER PUBLICATIONS

S. A. Aussenhofer et al: A quadrature HEM11 mode resonator as a new volume coil for high field MRI; ISMRM 2012, p. 538.
(Continued)

*Primary Examiner* — Tung X Nguyen
*Assistant Examiner* — Dominic E Hawkins

(57) ABSTRACT

An RF antenna system (100, 1014, 1014') transmits RF excitation signals into and/or receives MR signals from an MR imaging system's (1000, 1100, 1200) imaging volume (1015). The magnetic resonance imaging antenna includes a coil former (100, 1014, 1014') adjacent to the imaging volume (1015); and a resonator (400, 500, 600) attached to the coil former and tuned to at least one resonant frequency formed from electrical connections (304), between multiple capacitors (302). The multiple capacitors are distributed in a periodic pattern (300, 700, 800, 900) about and along the coil former.

18 Claims, 15 Drawing Sheets

(51) Int. Cl.
*G01R 33/36* (2006.01)
*G01R 33/422* (2006.01)

(56) References Cited

U.S. PATENT DOCUMENTS

| | | | |
|---|---|---|---|
| 6,452,394 B1 * | 9/2002 | Lappalainen | G01R 33/3628 |
| | | | 324/307 |
| 7,855,559 B2 * | 12/2010 | DeFranco | G01R 33/3657 |
| | | | 324/322 |
| 8,159,223 B2 | 4/2012 | Luekeke et al. | |
| 8,598,878 B2 * | 12/2013 | Taracila | G01R 33/3628 |
| | | | 324/318 |
| 8,854,042 B2 * | 10/2014 | Vaughan, Jr. | G01R 33/3415 |
| | | | 324/318 |
| 9,182,468 B2 * | 11/2015 | Kaneko | G01R 33/5659 |
| 9,459,331 B2 * | 10/2016 | Otake | G01R 33/365 |
| 2005/0124379 A1 | 6/2005 | Hao | |
| 2007/0247158 A1 | 10/2007 | Nistler | |
| 2009/0009169 A1 * | 1/2009 | Schulz | G01R 33/34046 |
| | | | 324/318 |
| 2010/0039111 A1 | 2/2010 | Luekeke et al. | |
| 2010/0109841 A1 | 5/2010 | Yamada et al. | |
| 2015/0241530 A1 | 8/2015 | Schmid | |
| 2016/0232307 A1 | 8/2016 | Nagai et al. | |

OTHER PUBLICATIONS

Y. Zhu et al: Versatile Volume Coil Implementation Using a Constellation Coil; ISMRM 2011, p. 3833.
Hayes et al "A Distributed Capacitor Endcap for Head Coils At 1.5T and 3.0T" Proc. Intl. Soc. Mag. Reson. Med 11 (2004) p. 1564.

* cited by examiner

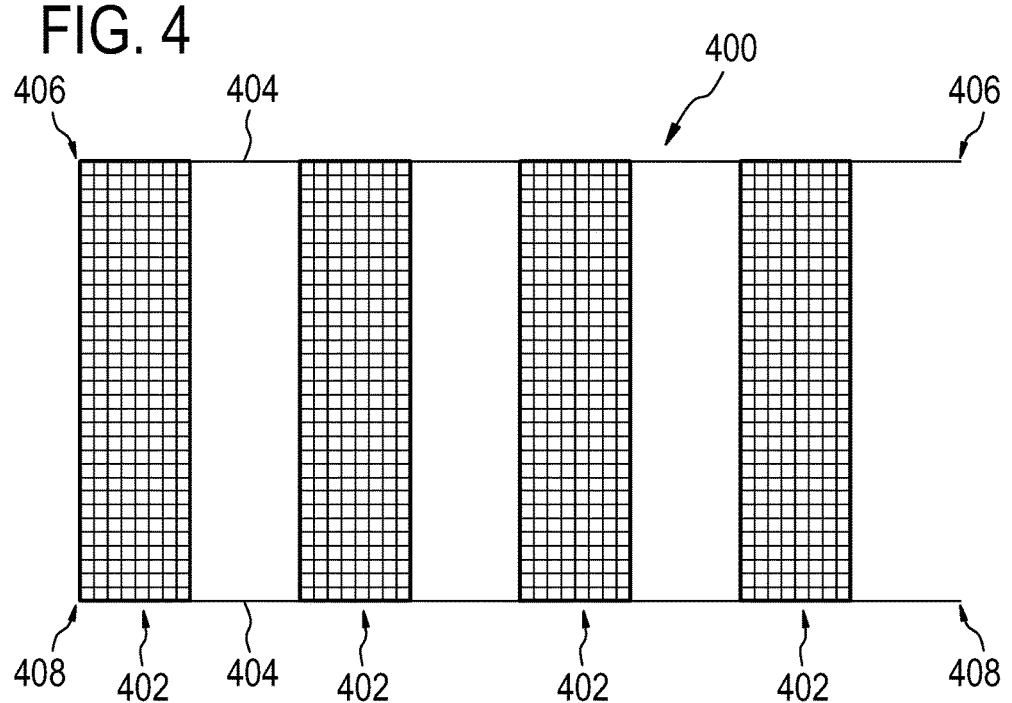
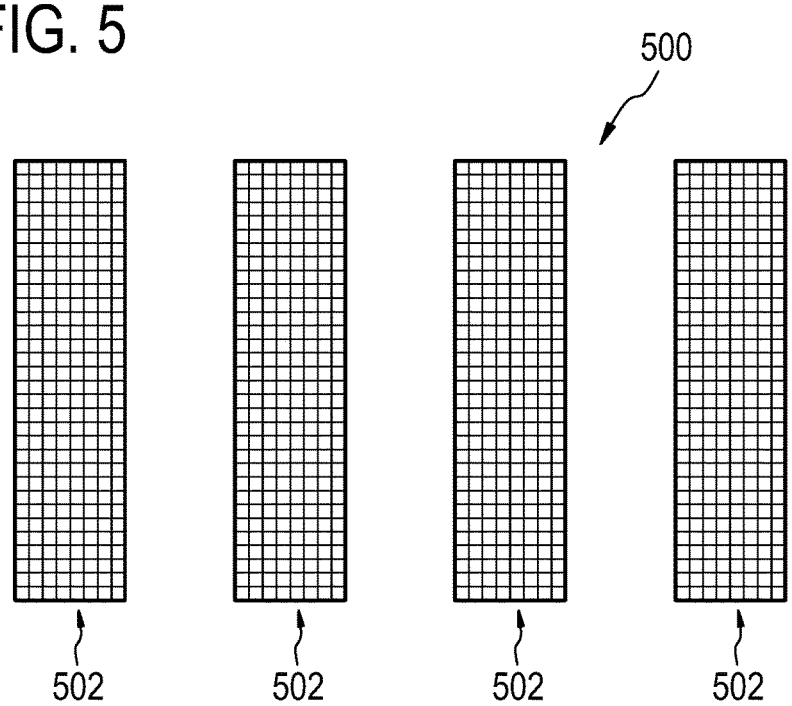

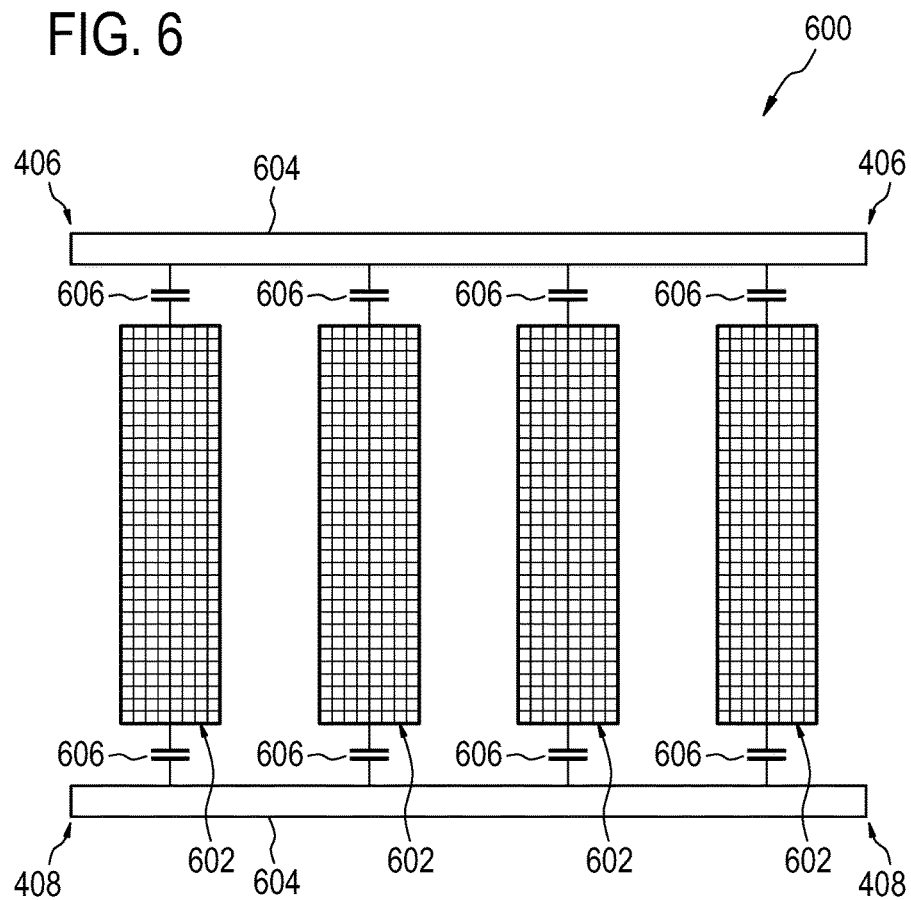

MAGNETIC RESONANCE IMAGING RF ANTENNA

CROSS REFERENCE TO RELATED APPLICATIONS

This application is a U.S. national phase application of International Application No. PCT/EP2015/054194, filed on Feb. 27, 2015, which claims the benefit of EP Application Serial No. 14161217.6 filed on Mar. 24, 2014 and is incorporated herein by reference.

TECHNICAL FIELD

The invention relates to magnetic resonance imaging, in particular it relates to radio-frequency antennas for magnetic resonance imaging.

BACKGROUND OF THE INVENTION

A large static magnetic field is used by Magnetic Resonance Imaging (MRI) scanners to align the nuclear spins of atoms as part of the procedure for producing images within the body of a patient. This large static magnetic field is referred to as the B0 field.

During an MRI scan, Radio Frequency (RF) pulses generated by a transmitter coil cause perturbations to the local magnetic field, and RF signals emitted by the nuclear spins are detected by a receiver coil. These RF signals are used to construct the MRI images. These coils can also be referred to as antennas. Further, the transmitter and receiver coils can also be integrated into a single transceiver coil that performs both functions. It is understood that the use of the term transceiver coil also refers to systems where separate transmitter and receiver coils are used. The transmitted RF field is referred to as the B1 field.

Today, almost all MRI systems are delivered with a Quadrature Body Coil (QBC), which is realized by a birdcage geometry. This is made of two conductive rings, which are connected via (typically 8-24 also conductive) rungs. The structure is made resonant by capacitors in the rungs (low-pass birdcage), the rings (high-pass birdcage) or both (band pass-birdcage). This coil is able to produce a homogeneous B1 field in a limited field of view (FOV).

European patent EP 2097763 (US 2009/0009169) to Schulz discloses an RF coil for a magnetic resonance imaging system for transmitting RF excitation signals and receiving MR relaxation signals. The RF coil includes an array of patches which are capacitively coupled with each other. The array of patches forms a resonant surface on which surface currents can be resonantly excited for generating at least one field modus.

SUMMARY OF THE INVENTION

The invention provides for an antenna for a magnetic resonance imaging system and a magnetic resonance imaging system in the independent claims. Embodiments are given in the dependent claims.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments computer storage may also be computer memory or vice versa.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the "C" programming language or similar programming languages and compiled into machine executable instructions. In some instances the computer executable code may be in the form of a high level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It will be understood that each block or a portion of the blocks of the flowchart, illustrations, and/or block diagrams, can be implemented by computer program instructions in form of computer executable code when applicable. It is further understood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, gear sticks, steering wheel, pedals, wired glove, dance pad, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bistable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

Magnetic Resonance (MR) data is defined herein as being the recorded measurements of radio frequency signals emitted by atomic spins. The signals could for example be received by an antenna of a Magnetic resonance apparatus during a magnetic resonance imaging scan. Magnetic resonance data is an example of medical image data. A Magnetic Resonance Imaging (MRI) image is defined herein as being the reconstructed two or three dimensional visualization of anatomic data contained within the magnetic resonance imaging data. This visualization can be performed using a computer.

A radio-frequency switch as used herein encompasses a switch for connecting or disconnecting two portions of an electrical circuit and the radio-frequency switch is operable for conducting radio-frequency power. Examples of radio-frequency switches include, but are not limited to: PIN diodes, MEMS switches, and transistor switches.

In one aspect the invention provides a Radio Frequency (RF) antenna system for transmitting RF excitation signals and/or for receiving Magnetic Resonance (MR) signals in an MR imaging system. The RF antenna system may also be referred to as an antenna or magnetic resonance imaging antenna herein. The antenna may be operable for transmitting and/or receiving radio-frequency signals used in the process of acquiring magnetic resonance data. That is to say the antenna may be either a transmit and/or a receive antenna. The antenna may comprise a coil former adjacent to an imaging volume. A coil former as used herein encompasses a support structure for an antenna, antenna elements, or components of an antenna. The coil former may also comprise a part of the active antenna.

For example the coil former is a cylinder, wherein the cylinder has an interior region which forms the imaging volume. One example of a coil former may be a cylinder or tube which has an interior region or interior volume. For a cylindrical or tubular coil former, the interior region or interior volume may form the imaging volume. For a flat, flexible, or planar coil former the imaging volume may be a region adjacent to the coil former. The imaging volume as used herein encompasses a region adjacent or within an antenna for which the antenna will be operable for receiving or for sending a magnetic resonance signal.

The antenna further comprises at least one resonator tuned to a resonant frequency formed from electrical connections between multiple capacitors. A resonator as used herein encompasses one or more antenna elements. The multiple capacitors are distributed in a periodic pattern about and along the coil former.

For a cylindrical or tubular shaped coil former, along the cylinder refers to along the length of the cylinder. About the cylinder refers to around the diameter or circumference of the cylinder.

Embodiment may be beneficial because a large number of capacitors are used to form the resonator. This prevents the use of large capacitances which may lead to hot spots in radio-frequency energy when the antenna is used. The voltage drop across the multiple capacitors is therefore smaller in this case and electric fields in the vicinity of these capacitors are smaller.

In comparison to a standard birdcage coil, embodiments of antennas may reduce the stored energy inside the resonator. This strongly reduces the power demands and local SAR, while SNR and coil bandwidth can be increased. This may save costs in coil production as well as by reducing the power and bandwidth demands on the RF amplifier. The increased efficiency can also be used to reduce the space occupied by the body coil, what decreases costs in other parts of the system, i.e. gradients/main magnet.

One way of designing the resonator is through simulation. Such a simulation can be performed in different ways. One way is a port based simulation, which can be done in the Method of Moments (MoM). The MoM method is for example described in "Field Computation by Moment Methods" by Roger F. Harrington, IEEE Press, Piscataway, N.J. USA 1993, ISBN-10 0780310144. Using the MoM approach a network matrix (e.g. a scattering matrix) can be derived describing the behavior w.r.t. the ports. This can be used in a spice simulator to calculate the resonances. In that spice simulator, typically the lowest capacitance, generating a resonance at Larmor frequency, is the correct one.

In another embodiment the coil former is cylindrical or tubular in shape.

In other embodiments the coil former is not cylindrical. The cross-section in some examples may be circular or it also may be oval or other shape.

In other embodiments the coil former may be one or more two dimensional sheets.

In another embodiment the multiple capacitors have one or more nearest neighbors. Nearest neighbors of the multiple capacitors are either one of electrically isolated or they are connected in series electrically. In some examples all the capacitors are attached together in a web-like arrangement that forms a single resonator. In other embodiments the resonators are connected together in groups.

In another embodiment the coil former is formed from a dielectric former. The dielectric former may be made of a dielectric or insulating material. In some examples the dielectric former is formed from a planar former. The c planar former r comprises an first surface and second surface. Each of the multiple capacitors is formed by a first conductive portion and a second conductive portion. The first conductive portion is attached to the first surface. The second conductive portion is attached to the second surface. A portion of the dielectric former forms each capacitor with the first conductive portion and the second conductive portion. In this embodiment the dielectric former is used to construct the capacitors and metallic conductive portions are attached on the sides of the former to form the capacitors.

In another embodiment the coil former is formed from a cylinder shaped dielectric former. The dielectric former may be made of a dielectric or insulating material that is cylinder shaped. In some examples the cylinder is formed from a cylindrical dielectric former. The cylinder comprises an inner surface and an outer surface. Each of the multiple capacitors is formed by a first conductive portion and a second conductive portion. The first conductive portion is attached to the inner surface. The second conductive portion is attached to the outer surface. A portion of the cylinder forms each capacitor with the first conductive portion and the second conductive portion. In this embodiment the dielectric cylinder forms a portion of the capacitors and metallic conductive portions are attached on the sides of the cylinders to form the capacitors.

In other embodiments the dielectric cylinder is multilayered and there may be more than just a first and second conductive portion. Multiple layered capacitors may also be constructed.

In another embodiment the capacitance of each of the multiple capacitors is less than 50 pF.

In another embodiment the capacitance of each of the multiple capacitors is less than 70 pF.

In another embodiment the capacitance of each of the multiple capacitors is less than 80 pF.

Reducing the individual capacitance by using more capacitors may have a technical benefit by reducing the voltage drop across each capacitor. The value of the capacitors depends upon the number used. If the distance or the grid between capacitors is reduced then more capacitors are needed. The actual capacitance depends upon the B0 field used and the frequency to which it is intended to be tuned to. The frequency or the value of the capacitors will also depend upon the overall distance to an RF shield and the overall dimensions and the choice of a low pass, high pass, or band pass or similar structure for the resonator.

The use of multiple capacitors may also have the benefit of reducing the power demands. The individual current and voltages in the capacitors when compared to a standard body coil may be reduced.

In another embodiment the antenna is a body coil. A body coil as used herein encompasses a coil which is integrated into the magnetic resonance imaging system. Typically, body coils are installed into the bore of a cylindrical magnet. This embodiment may be beneficial because the currents and voltages in the body coil may be reduced when compared to a standard body coil. This may result in lower electric fields near the capacitors in the body coil and may also in some cases reduce the power demands.

In another embodiment the resonant frequency is a Larmor frequency for a spin packet within a main magnetic field of a magnetic resonance imaging system. In some cases the resonator may be tuned to more than one Larmor frequency in which case the resonator is a multi-frequency resonator. A spin packet as used herein is a number of spins affected by the same magnetic field. A spin packet could be different nuclei or molecules for example water or hydrogen on organic molecules.

In another embodiment the antenna comprises multiple resonators tuned to different resonant frequencies stacked on top of each other. That is to say one resonator is within the second resonator. This may be a useful way of making a resonator multi-frequency. For instance the cylinder could have an independent resonator on each surface each tuned to different frequencies.

In another embodiment the multiple capacitors comprise more than 1000 capacitors.

In another embodiment the multiple capacitors comprise more than 5000 capacitors.

In another embodiment the multiple capacitors comprise more than 10000 capacitors.

In another embodiment the antenna further comprises a radio-frequency shield surrounding the cylinder. The use of the radio-frequency shield may improve the efficiency of the antenna. The RF shield may for instance be a screen material, a slotted screen, or be made from an artificial magnetic conductor structure.

In some cases the cylindrical radio-frequency shield and the cylinder may have an identical axis of symmetry.

In another embodiment the radio-frequency feeds used for connecting to the antenna may in some cases have their ground attached to the radio-frequency shield.

In another embodiment the radio-frequency shield is formed from a web of conductive elements connected by capacitive elements. This embodiment may be beneficial particularly when the radio-frequency shield is tuned to a particular frequency. For instance the radio-frequency shield could be used to block out the same resonant frequency as a resonator. This would enable other radio frequencies to pass through the radio-frequency shield that only block the resonator.

In another embodiment the RF shield or RF screen is provided in the form of an artificial magnetic conductor (AMC) structure which is resonant in an RF frequency band. The RF frequency band may be identical to an RF frequency band for the RF excitation signals or received RF signals during the acquisition of magnetic resonance data.

In some examples, the AMC structure may comprise an array of metal patches positioned on a metallic ground plate with a dielectric substrate there between. The patches are connected by means of grounding posts with the ground plane or instead of the grounding posts metal strips are provided to form a ground return path. The AMC structure further comprises a plurality of edge capacitors connection adjacent edges of the patches for capacitively coupling the patches with each other. The edge capacitors may be switchable capacitors so that by switching the capacitors the resonant frequency of the AMC structure can be controlled, or in that switches are provided for shorting said edge capacitors for detuning or deactivating the RF antenna system. Such an RF screen is described in PCT publication WO 2008/078284 A2, which is herein incorporated by reference.

In another embodiment the antenna further comprises multiple detuning radio-frequency switches connected between the cylindrical radio-frequency shield and the resonator. When closed or connecting the resonator to the radio-frequency shield the detuning radio-frequency switches detune the resonator. The detuning radio-frequency switches as used herein are radio-frequency switches. The adjective "detuning" in detuning radio-frequency switches is used as a label to indicate a particular group of radio-switches. For example "first radio-frequency switches" could be used as a substitute for "detuning radio-frequency switches."

The placement of the multiple detuning radio-frequency switches is highly dependent upon the particular radio-frequency shield used and the particular design of the resonator. The location of where to place the switches can be performed by making a computer model of the resonator and looking for regions where there are higher than average electric field points. This may also be determined empirically by performing measurements on a particular resonator design. By connection these high field points to the radio-frequency shield via a radio-frequency switch the resonator can be effectively detuned from the resonant frequency.

In another embodiment, the antenna also comprises one or more secondary resonant structures (e.g. like a birdcage or loop coils), which can be switched on and off by RF switches. Due to (mainly inductive) coupling of both structures, the on-state can be used for detuning the primary antenna.

In another embodiment the periodic pattern is segmented into electrically isolated groups. Each of the electrically isolated groups is electrically isolated. Each of the electrically isolated groups is operable to be connected to a separate radio-frequency channel.

In another embodiment the at least one resonant frequency is multiple resonant frequencies. Each of the electrically isolated groups is tuned to a single resonant frequency selected from the multiple resonant frequencies. This embodiment may provide for a reliable means of creating resonators with multiple frequencies. For example two resonant frequencies could be selected. Half of the electrical isolated groups could be tuned to one frequency and the other half could be tuned to the second frequency.

In another embodiment the RF antenna system is a surface coil comprising one or more antenna elements, wherein each of the antenna elements is one of the electrically isolated groups, and wherein the surface coil is adjacent to the imaging volume.

In another embodiment the cylinder has a rotational axis of symmetry. The periodic pattern is segmented into electrically isolated groups along the rotational axis of symmetry. A long an axis of symmetry is lengthwise around the axis of symmetry. This may also be considered to be a segmentation in the so called z-direction.

As an alternative, the antenna can be designed such that different RF ports excite different resonances in the resonator. These resonances may have the same resonant frequency, but excite B1-fields with different spatial profiles. In this way the amount of RF power fed to different ports can be used to adjust the configuration of the antenna. It can also be used for RF-shimming or more advanced parallel transmit concepts like e.g. Transmit Sensitivity Encoding (Tx-SensE).

In another embodiment the dielectric cylinder has an axis of symmetry. The periodic pattern is segmented into electrically isolated groups about the axis of symmetry. The segmentation is around the diameter or circumference of the antenna. This effectively divides the resonator into a number of electrically isolated groups which lie in the same direction as the axis of symmetry. This may enable the construction of a birdcage-like coil with reduced electric fields around the capacitors.

In another embodiment the electrically isolated groups twist about the axis of symmetry. Instead of simply going straight along the axis of symmetry the strips of the electrically isolated groups may twist about or around the axis of symmetry. This may enable more uniform electric fields to be generated by the antenna.

In another embodiment the electrically isolated groups comprise multiple radio-frequency switches arranged for connecting the electrically isolated groups electrically. This may be beneficial because it may enable the configuration of the antenna to be performed on the fly or for example be controlled by a pulse sequence.

In another aspect the invention provides for a magnetic resonance imaging system for acquiring magnetic resonance data from an imaging zone. The imagine volume is within the imaging zone. The imaging zone is the region of high and uniform magnetic field which enables the position of magnetic resonance data. The imaging volume is the region or space which is able to be imaged by the particular antenna or coil. The statement that the imaging volume is within the imaging zone is equivalent to stating that the antenna is installed into the magnetic resonance imaging system such that it is operable for the acquisition of magnetic resonance data. The magnetic resonance imaging system comprises an antenna according to an embodiment of the invention.

In another embodiment the antenna is according to an embodiment where the periodic pattern is segmented into electrically isolated groups. The magnetic resonance imaging system further comprises a radio-frequency system operable for separately supplying each of the electrically isolated groups with radio-frequency power. The magnetic resonance imaging system further comprises one or more processors for controlling the magnetic resonance imaging system. The magnetic resonance imaging system further comprises a memory for storing machine-executable instructions and pulse sequence data. Execution of the machine-executable instructions causes the processor to control the magnetic resonance imaging system to acquire the magnetic resonance data according to the pulse sequence data.

Pulse sequence data as used herein encompasses data which is descriptive of or contains control commands which enable the magnetic resonance imaging system to acquire magnetic resonance data according to a particular magnetic resonance imaging protocol or technique. The pulse sequence data further comprises data for controlling the radio-frequency system to adjust the phase and/or radio-frequency power supplied to each of the electrically isolated groups during the acquisition of the magnetic resonance data. This embodiment is beneficial because it enables e.g. the so called radio-frequency shimming of the antenna during the acquisition of magnetic resonance data. It also enables more advanced parallel transmit concepts like e.g. Transmit Sensitivity Encoding (TxSensE).

In another embodiment the magnetic resonance imaging system comprises an antenna according to an embodiment which has multiple radio-frequency switches arranged for connecting the electrically isolated groups electrically. The magnetic resonance imaging system further comprises a radio-frequency switch controller system for controlling the switching of the multiple control radio-frequency switches. The magnetic resonance imaging system further comprises a radio-frequency system operable for supplying each of the electrically isolated groups or at least a portion of them with radio-frequency power. The magnetic resonance imaging system further comprises one or more processors for controlling the magnetic resonance imaging system.

The magnetic resonance imaging system further comprises a memory for storing machine-executable instructions and pulse sequence data. Execution of the machine-executable instructions causes the processor to control the magnetic resonance imaging system to acquire the magnetic resonance data according to the pulse sequence data. The pulse sequence data comprises data for controlling the radio-frequency switch controller during acquisition of the magnetic resonance data. This embodiment is beneficial because it enables the configuration of the resonator during the acquisition of magnetic resonance data. In some embodiments the spacing and/or the grid shaping between capacitors may be non-equidistant in order to shape the electric field.

In other embodiments the values of the individual capacitors could be chosen to be unequal. This may particularly be done by varying the value of the capacitance along the z-direction or the axis of the cylinder.

In other embodiments the resonator may be tuned to more than one frequency and may therefore be multi-frequency for looking at multiple nuclei during magnetic resonance imaging. This may for instance be accomplished by tuning the resonator to more than one frequency or using more than one resonator according to an embodiment which are layered. That is, multiple resonators could be layered to create an antenna tuned to more than one frequency. The distribution of capacitors and conductive elements may be different in the different layers.

In another embodiment, a multilayer structure may also be used to mainly increase the capacitive density, e.g. for low field MR, which demands a lower resonance frequency.

In another embodiment the currents supplied to various portions of the resonator may be shaped by controlling radio-frequency switches.

It is understood that one or more of the aforementioned embodiments of the invention may be combined as long as the combined embodiments are not mutually exclusive.

BRIEF DESCRIPTION OF THE DRAWINGS

In the following preferred embodiments of the invention will be described, by way of example only, and with reference to the drawings in which:

FIG. 4 illustrates one way of constructing a body coil 400;

FIG. 5 illustrates a further example of body coil 500;

FIG. 6 shows a further example of a body coil 600;

DETAILED DESCRIPTION OF THE EMBODIMENTS

Figure 1:
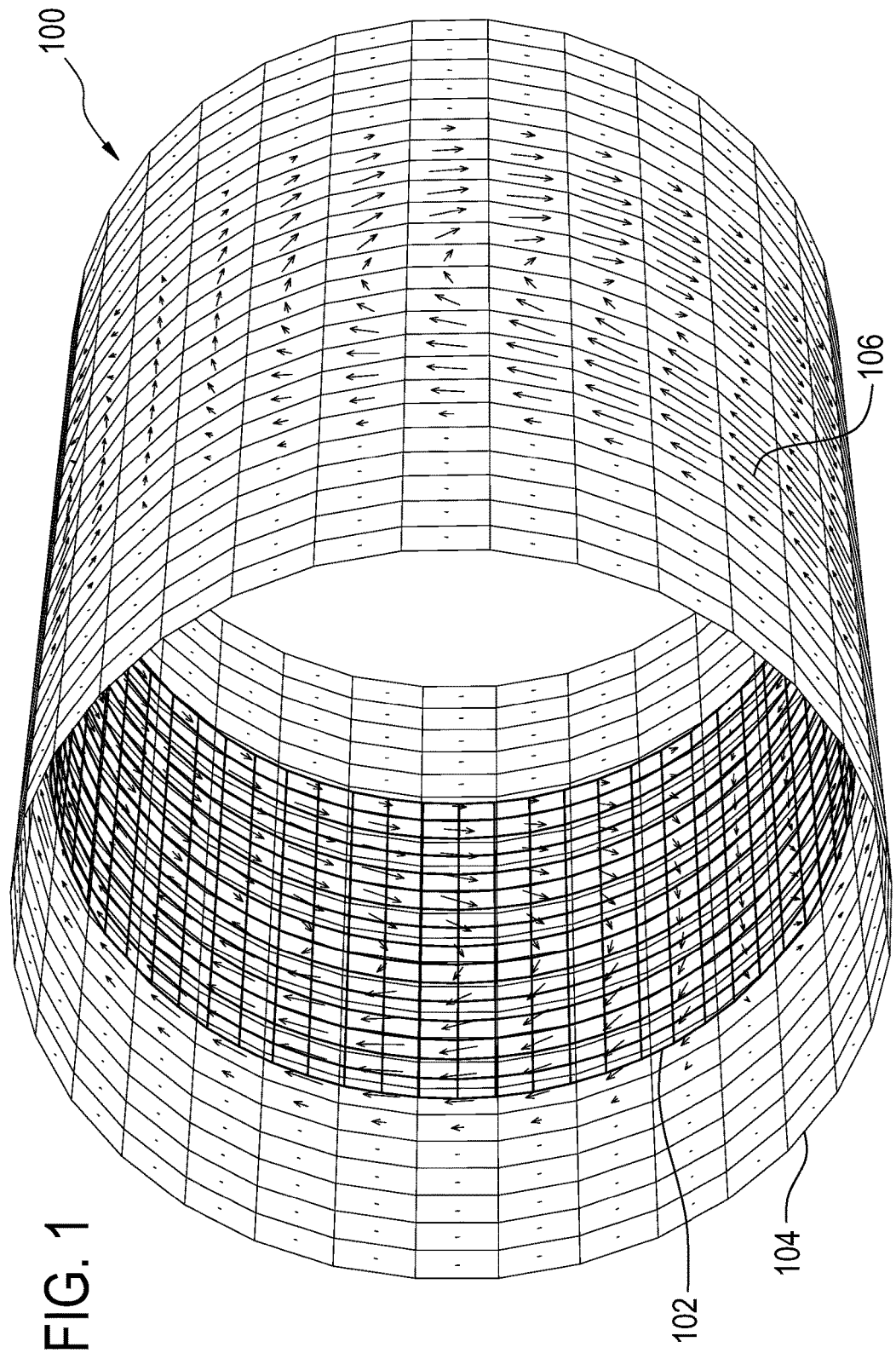
FIG. 1 shows simulation results of a model of an antenna 100.

Like numbered elements in these figures are either equivalent elements or perform the same function. Elements which have been discussed previously will not necessarily be discussed in later figures if the function is equivalent.

Examples of the antenna or resonator may be useful to replace the current Quadrature Body Coils (QBC) in MRI systems. Compared to the state of the art, which is the birdcage coil, examples of the antenna described herein may have strongly reduced local SAR, significantly lower power demands, and a higher SNR. The coil can be realized without expensive lumped capacitors. This may save costs by providing for a cheaper construction and reduced power demands for the RF amplifier.

Currently used birdcage coils already are already optimized designs with respect to (especially global) SAR, power efficiency, FOV size, and SNR. However, they still have some drawbacks which can be resolved by the proposed invention:

In wide bore and/or high field MRI systems, the imaging speed and/or SNR is often limited by local SAR constrains, which appear typically near the coil conductors, especially in proximity to the resonance capacitors.

In modern designs with a small distance to an RF-shield, the power demands drastically increase. Often just half of the power reaching the coil is used for B1 field generation inside the patient, while the other half is dissipated by the coil. This additional power (loss) has to be delivered by the transmit amplifier. First simulations showed a factor of three in loss reduction for the proposed design compared with the today used birdcage coil. This impact is comparable to the cable losses which can be reduced by placing the amplifier directly at the coil.

The (RF) transmit amplifier is specified in a bandwidth, which is mainly defined by the gradient strength and the FOV. The input impedance of a birdcage coil varies a lot in this bandwidth due to the resonance. Because of the much higher loading factor of the proposed design, the bandwidth can be increased roughly by a factor of two, which strongly reduces the reflected power and therefore the amplifier specification.

The birdcage design needs expensive manually mounted high power capacitors. These can be replaced by low cost devices or a laminate material.

The coil has to be fine-tuned manually during production. This might become unnecessary or at least automated.

A high number of single rungs have to be used for generating a homogeneous field. The new design does quasi not have countable conductors and uses distributed currents instead.

The antenna or RF coil resonators described herein may use an artificial dielectric material. Instead of using a small number of high power capacitors, the proposed design uses a (very) high number of low power capacitors, which, in one example, can be realized by a laminate PCB instead of lumped elements. The limited number of birdcage-coil conductors (48 for a 16-rung birdcage) may be replaced by at least a few 1000 conductors. Instead of lumped conductors with capacitors, the structure behaves like a 2D dielectric conductor that can be described with wave propagation theory. Compared to already shown resonators with a 3-dimensional dielectric medium, the proposed design is more effective in combination with an RF screen since the (displacement) current is forced to the maximum screen distance which increases the effectively produced B1 field. This RF screen may be useful for a body coil design since it separates the RF fields from the low frequency gradient system. It could be realized also by a resonant structure using the same principle.

A physical principle which may differentiate exemplary antennas from the state of the art bodycoil designs is the strongly reduced stored energy in the structure. Due to the very distributed current, the total inductivity is as low as possible.

For every resonator, the power is given by: $P=\omega W/Q$, with $\omega$ the (angular) frequency, $W$ the stored energy and $Q$ the quality factor. Since $\omega$ is given by the Larmor frequency and Q is limited by the capacitors or laminate material (typically around 500), the coil efficiency can just be increased by decreasing the stored energy. Since the magnetic (B1) field is mainly defined by the total current, the stored energy is reduced directly be reducing the total inductivity of the coil.

Figure 2:
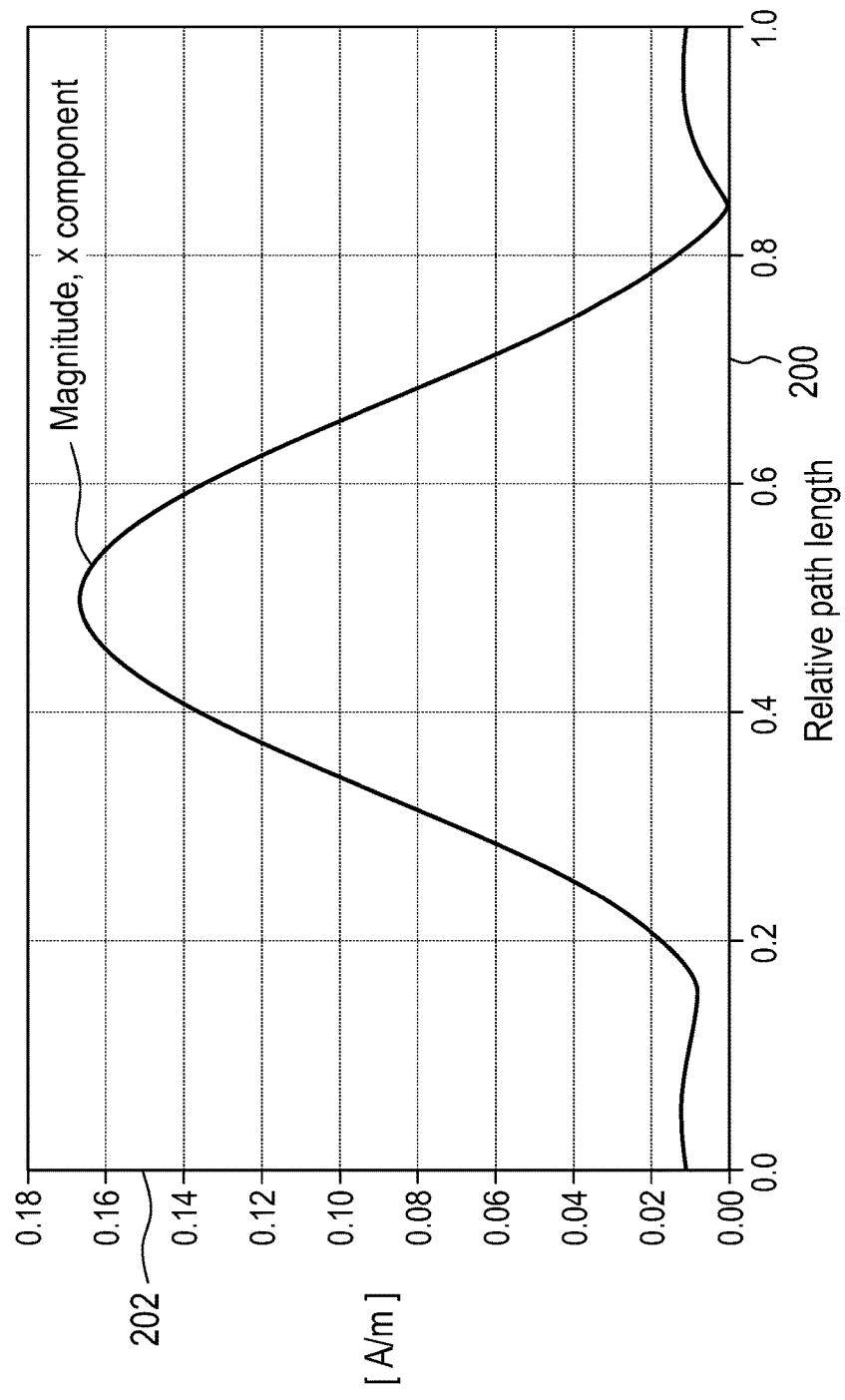
FIG. 2 shows a plot of the B1 magnetic field 202 plotted against the position or distance 200 generated by the antenna shown in FIG. 1.

FIG. 1 shows simulation results of a model of an antenna 100. The grid labeled 102 represents the resonator and the grid labeled 104 represents a radio-frequency shield. The arrows, one of which is labeled 106, illustrate the electric surface currents on the radio-frequency shield. FIG. 1 shows a simplified model of the proposed antenna or resonator concept. The RF screen is assumed with 76 cm diameter and the coil conductors are located 2 cm above. The resonator is made of 2112 lumped capacitors of roughly 70 pF. The first resonance of this structure is excited by a single point at the end of the structure. Assuming a quality factor of 500 for the capacitors, the simulation predicts an input impedance of about 5 ohms, which can be easily matched to the feeding system. Due to patient loading this impedance will further increase. The structure needs just about 600 W for generating 13.5 uT at 3T frequency. This is roughly a half to third of some similar body coils. FIG. 2 shows the B1-profile in axial direction.

FIG. 2 shows a plot of the B1 magnetic field 202 plotted against the position or distance 200 generated by the antenna shown in FIG. 1. The antenna has a total length of 1 m. The B1 profile is at the center or axis of symmetry of the antenna 100.

The reduction to half the maximum value is defining a FOV of roughly 35 cm, which is slightly smaller compared to a birdcage coil. This is due to the effective length that is reduced by the distributed current instead of lumped rings.

In this simulation, the structure is having equal distances and equal capacitors in both directions. This can be changed due to different target applications. The RF-field can for example be shaped by adjusting the capacitor values in axial direction. For more than two-port feeding, the port decoupling can be improved by an optimized capacitor ratio in axial and peripheral direction. However, for a replacement of the current QBC, just two ports are needed which are given by (at least) the geometrically separated feeding points in 90° offset.

One design can use a much more increased number of capacitors which then will not be realized by single components. A low loss laminate material should be used instead while the capacitors are realized by overlap of two or more copper layers. Since the capacitive density mainly defines the resonance frequency, the number of capacitors is mainly limited by the PCB production process. This means, that the current is extremely much distributed. This strongly reduces the local SAR since there are no hot spots of electric fields any more in the coil (The size of single structures may by very small compared to the patient distance).

A further optimized coil could use a similar structure for the RF-screen as well. In this case the number of resonances is roughly doubled and the screen is just effective for the modes with contrary current directions in the two layers, which can be solved easily by design.

The coil can be switched of (detuned) e.g. by PIN-diodes or other radio-frequency switches which connect selected points of the resonator to the shield, in such a way, that the resonance is destroyed. These points typically appear at areas with high (absolute) electric potential.

The coil could also be equipped with a set of switches that configure the design in different ways. This could be used e.g. for RF-shimming (with just one amplifier) or for FOV manipulation.

The single capacitors have much lower currents and just small voltages. Therefore sparking issues are strongly reduced and the coil could be tuned by milling the copper areas with a robot. In production it would be proposed to measure the capacitive density of the laminate before acid-treat. In this way, the tuning can mainly be solved in advance and the coil could be resonant already with the first mounting. This approach could also be used by milling in 2D before mounting the coil PCB, e.g. after measuring the initial resonance(s) in a 2D setup.

Figure 3:
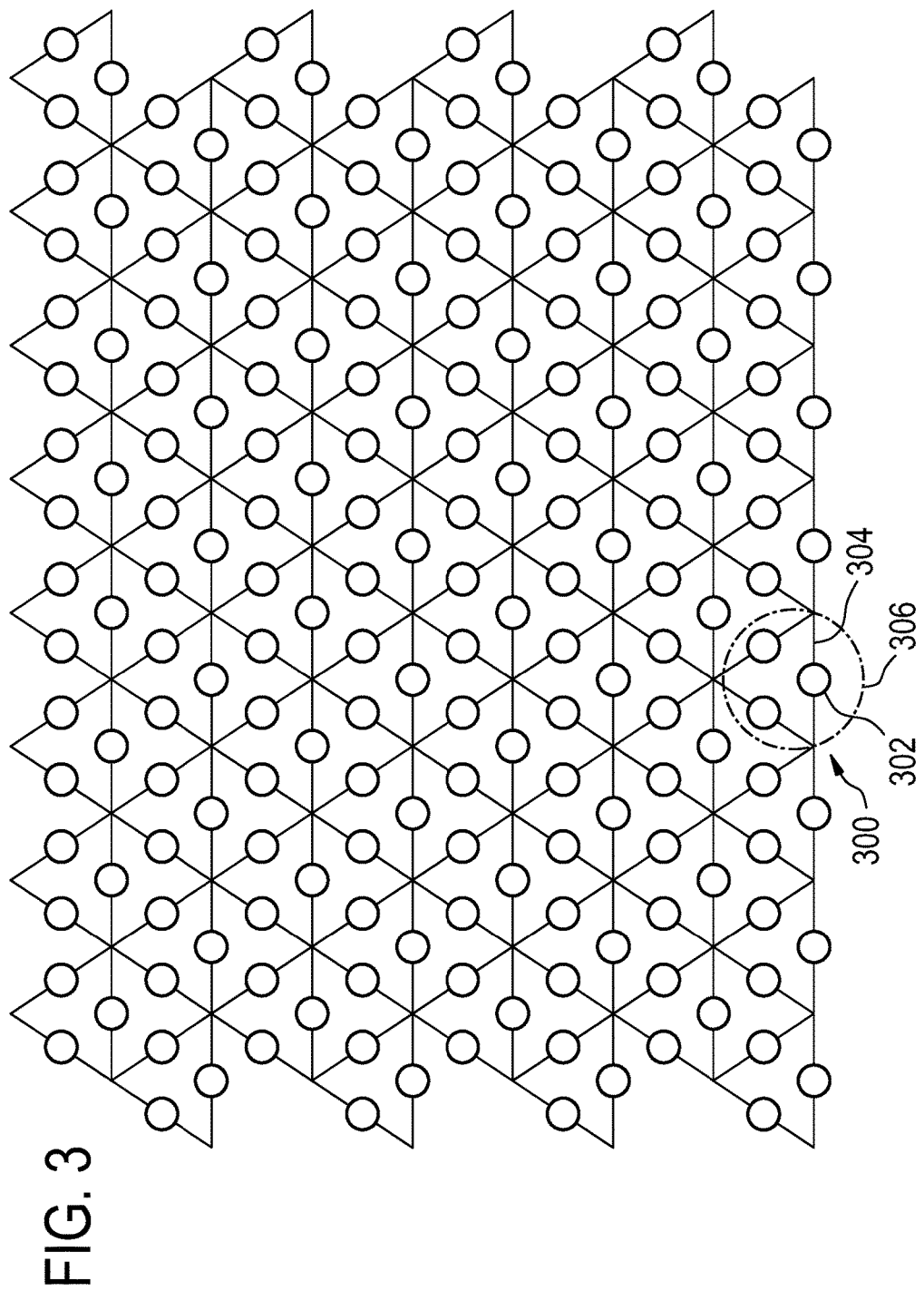
FIG. 3 illustrates an example of a periodic pattern which could be distributed about a cylinder to form a resonator.

FIG. 3 illustrates an example of a periodic pattern which could be distributed about a cylinder to form a resonator. This periodic pattern 300 is formed by individual triangular cell elements 306. The cell element 306 is formed by three capacitors 302 which are connected by conductors 304. This particular resonator design uses individual triangular cell elements 306 with the circular points 304 representing capacitors. The individual knots or points can further be connected to ground or a radio-frequency screen via capacitors forming a two-dimensional TEM artificial structure. Three-dimensional body coil structures can be made using for example laser printing using different conductive and stabilizing material. FIG. 3 illustrated one example of an antenna or resonator concept using individual triangular cell elements. Circular points represent capacitors. The individual knots can further be connected to ground or RF screen via capacitors forming a 2D TEM artificial structure. 3D body coil structures can be made via laser printing using different conductive and stabilizing material.

FIG. 4 illustrates one way of constructing a body coil 400. The grids labeled 402 represent electrically isolated groups of the body coil 400. The regions 402 are segments of the overall resonator. The exact pattern of the capacitors is not shown in this design and is represented arbitrarily using the grids. The regions labeled 404 are conductors which connect the electrically isolated groups 402. The points labeled 406 are connected together by wrapping the whole unit into a cylinder shape. The points labeled 408 are also connected. The view of the body coil 400 shown in FIG. 4 can be considered to be a body coil which has been cut and then laid flat. In FIG. 4 the body coil concept is illustrated. Various parts of the conductor or segments 402 are artificial dielectric and are connected galvanically. A benefit may be a reduction of local SAR close to coil conductors by having a more homogeneous radio-frequency current distribution. FIG. 4 shows an exemplary body coil design, where parts of the conductor are an artificial dielectric and are connected galvanically. Beneficial is a reduction of local SAR close to coil conductors by more homogeneous RF current distribution FIG. 5 illustrates a further example of body coil 500. This body coil 500 is comprised by individual segments 502 but in this example the segments are not connected together. The segments 502 may be laid or embedded into a cylinder to form the antenna. The multi-element transmit body coil concept or design shown in FIG. 5 has parts of the conductor [which] may be made of artificial dielectric media. Individual planar artificial dielectric transmit and receive coil elements 502 may be fed at four different ports. Feeding of the structure is performed inductively or via impedance matching networks galvanically connected to ground or different impedance locations at the artificial dielectric. It may be noted that the whole structure shown in FIG. 1 can be driven via multi-port connection using a set of radio-frequency amplifiers.

FIG. 5 shows a multi-element transmit body coil or antenna concept, where parts of the conductor are made of artificial dielectric media. Individual planar artificial dielectric transmit and receive coil elements are feed at ports. Feeding of the structures is performed inductively or via impedance matching networks galvanically connected to ground or at different impedance locations at the artificial dielectric. Even the whole structure shown in FIG. 1 can be driven via multi-port connection a set of RF amplifiers. A similar structure can also be built by using connections to the surrounding RF-shield which then makes it behave at least partly like a TEM resonator.

FIG. 6 shows a further example of a body coil 600. The body coil in FIG. 6 is also then essentially cut and laid out to illustrate the design. The body coil 600 is made out of electrically isolated groups 602. These are the segments 602 of the resonator. On either end of the body coil are conductors 604. Capacitors 606 are then used to connect the conductor 604 to the capacitor 606. The points labeled 406 are wrapped around and connected to each other electrically and the points 408 are wrapped around and connected to themselves electrically. FIG. 6 shows a Body coil design, where parts of the coil conductor consist of an artificial dielectric medium. Both, rods or ring structures, can consist of artificial dielectric material. Distribution and variation of the capacitor value and/or grid layout allows flattening the spatial RF current distribution.

The 2D structure can also be twisted, which might be beneficial for homogeneity. The proposed resonator concept can be combined with conventional resonator elements, e.g. as shown in FIG. 6 or also with traditional coils to act just as a local field booster. Combination might be advantageous for reason like cost, RF power coupling and serviceability. The proposed resonator concept can even be segmented in z direction.

Figure 7:
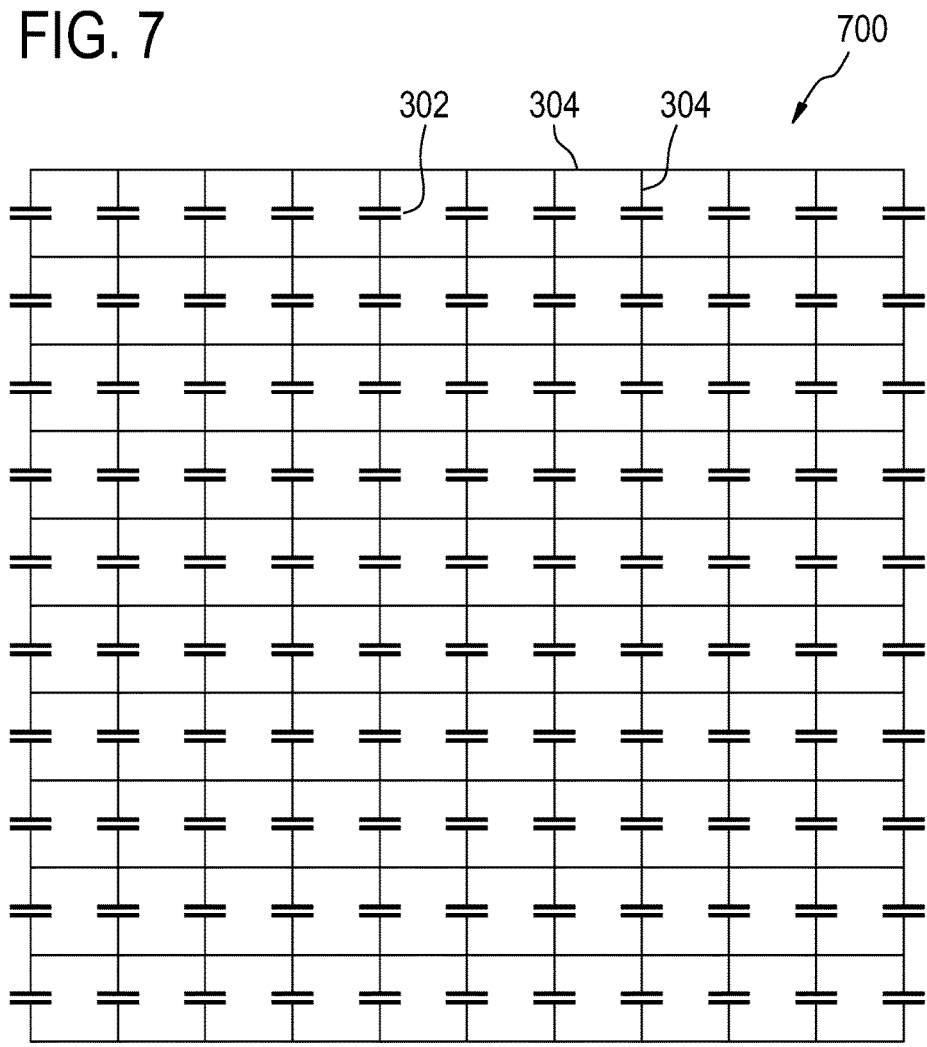
FIG. 7 illustrates a further example of a periodic pattern which could be distributed about a cylinder to form a resonator.

FIG. 7 shows an alternative periodic pattern 700. The periodic pattern 700 shows capacitors 302 connected by conductors 304. The capacitors 302 are arranged in groups that are connected in parallel and the individual groups are connected in series. The pattern 700 could wrap around forming a homogeneous structure on a whole cylinder. In other cases the pattern 700 could be used to form strips or portions of a resonator.

Figure 8:
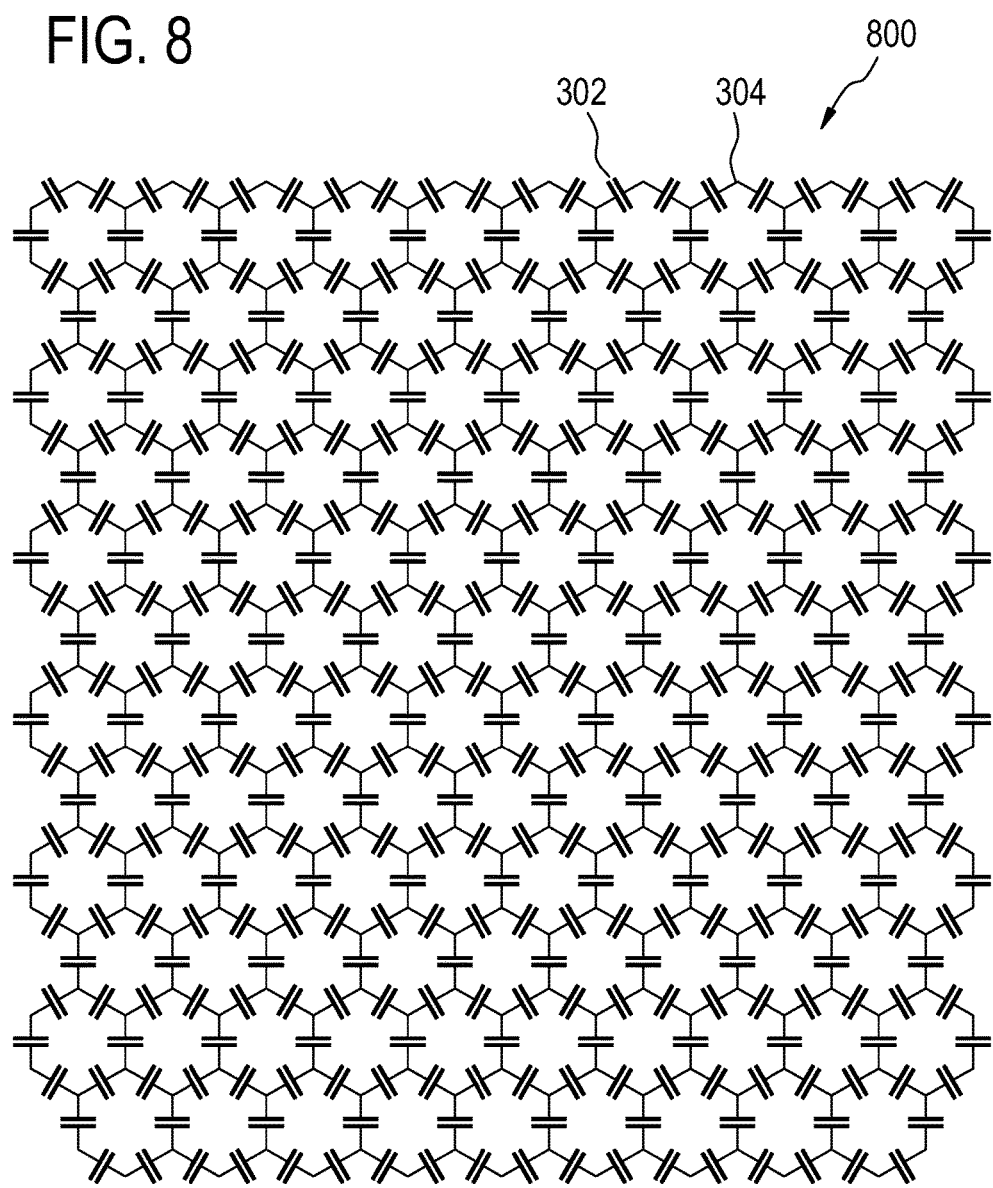
FIG. 8 illustrates a further example of a periodic pattern which could be distributed about a cylinder to form a resonator.

FIG. 8 shows an alternative periodic pattern which may be used to arrange the multiple capacitors. In this arrangement, capacitors 302 are arranged in a hexagonal pattern and connected by conductors 304.

Figure 9:
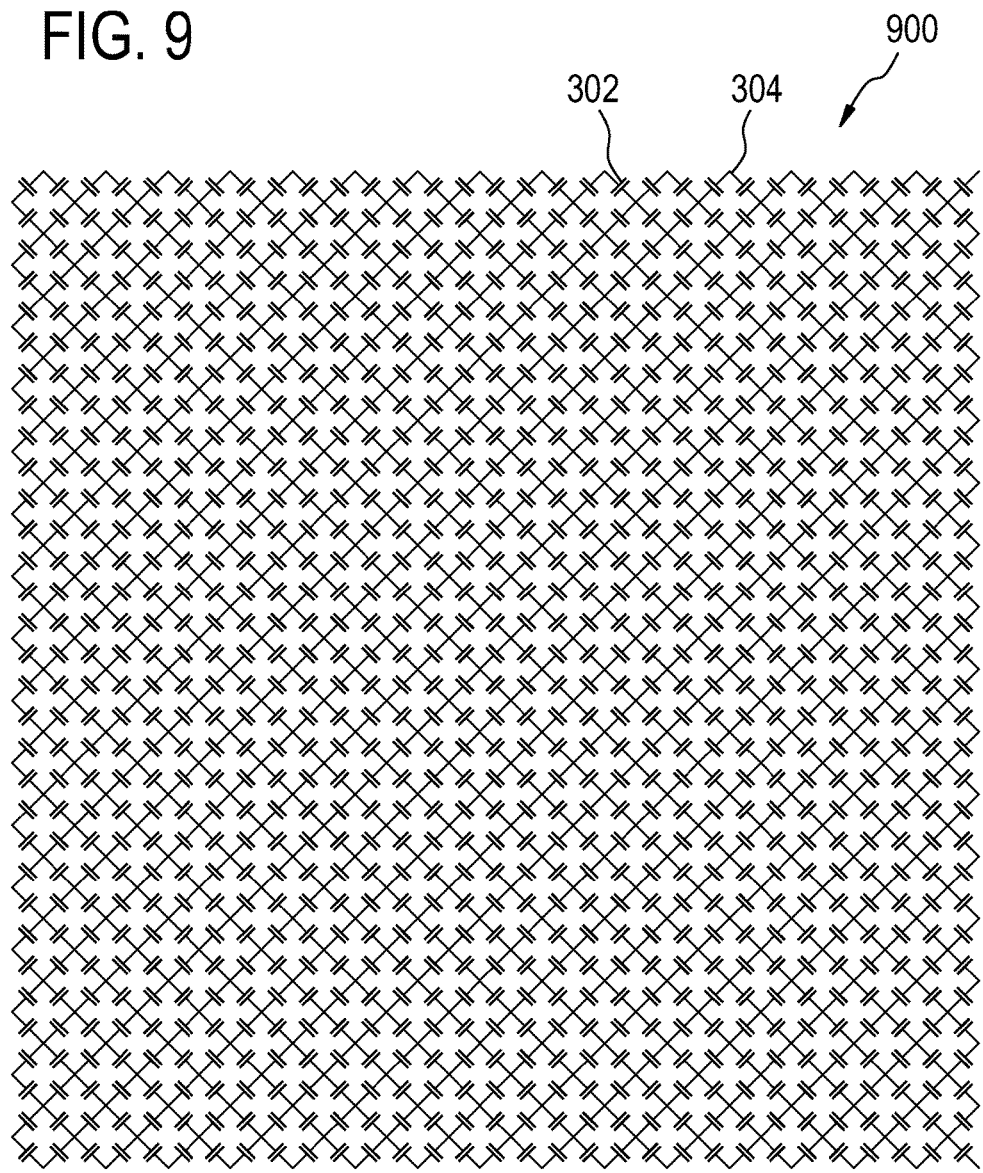
FIG. 9 illustrates a further example of a periodic pattern which could be distributed about a cylinder to form a resonator.

FIG. 9 shows an alternative periodic pattern 900 that may be used for distributing capacitors 302. The capacitors 302 are arranged in a square pattern and are connected by conductors 304.

Figure 10:
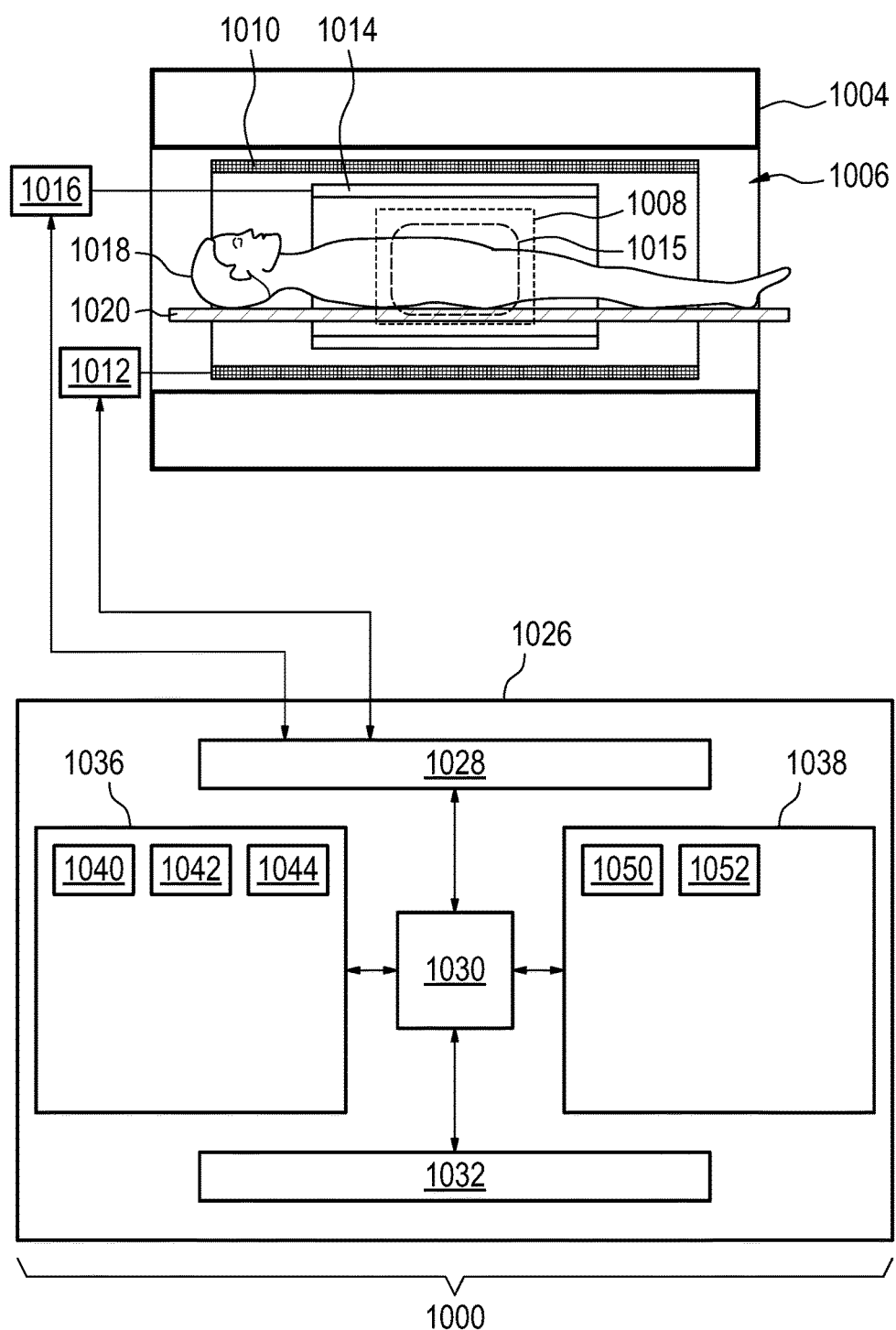
FIG. 10 illustrates an example of a magnetic resonance imaging system.

FIG. 10 illustrates an example of a magnetic resonance imaging system 1000 according to an embodiment of the invention. The magnetic resonance imaging system 1000 comprises a magnet 1004. The magnet 1004 is a superconducting cylindrical type magnet 1004 with a bore 1006 through it. The use of different types of magnets is also possible for instance it is also possible to use both, a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils. Within the bore 1006 of the cylindrical magnet 1004 there is an imaging zone 1008 where the magnetic field is strong and uniform enough to perform magnetic resonance imaging.

Within the bore 1006 of the magnet there is also a set of magnetic field gradient coils 1010 which is used for acquisition of magnetic resonance data to spatially encode magnetic spins within the imaging zone 1008 of the magnet 1004. The magnetic field gradient coils 1010 connected to a magnetic field gradient coil power supply 1012. The magnetic field gradient coils 1010 are intended to be representative. Typically magnetic field gradient coils 1010 contain three separate sets of coils for spatially encoding in three orthogonal spatial directions. A magnetic field gradient power supply supplies current to the magnetic field gradient coils. The current supplied to the magnetic field gradient coils 1010 is controlled as a function of time and may be ramped or pulsed.

Adjacent to the imaging zone 1008 is an antenna 1014 for manipulating the orientations of magnetic spins within the imaging zone 1008 and for receiving radio transmissions from spins also within the imaging zone 1008. The radio-frequency antenna 1014 comprises a cylinder surrounding an imaging volume 1015. The antenna is constructed according to an example as detailed in the text. The imaging volume 1015 is shown as being within the imaging zone 1008. The radio frequency antenna may contain multiple coil elements. The radio frequency antenna may also be referred to as a channel or antenna.

The antenna 1014 is connected to a radio frequency transceiver 1016. The antenna 1014 and radio frequency transceiver 1016 may be replaced by separate transmit and receive coils and a separate transmitter and receiver. It is understood that the antenna 1014 and the radio frequency transceiver 1016 are representative. The antenna 1014 is intended to also represent a dedicated transmit antenna and/or a dedicated receive antenna. Likewise the transceiver 1016 may also represent a separate transmitter and receivers. The antenna 1014 may also have multiple receive/transmit elements and the radio frequency transceiver 1016 may have multiple receive/transmit channels.

The magnetic field gradient coil power supply 1012 and the transceiver 1016 are connected to a hardware interface 1028 of computer system 1026. The computer system 1026 further comprises a processor 1030. The processor 1030 is connected to the hardware interface 1028, a user interface 1032, computer storage 1034, and computer memory 1036.

The computer storage 1036 is shown as containing pulse sequence data 1040 which enables the processor 1030 to perform a magnetic resonance imaging protocol using the magnetic resonance imaging system 1000. The computer storage 1036 is shown as further containing magnetic resonance data 1042 acquired using the radio-frequency antenna 1014. The computer storage 1036 is further shown as containing a magnetic resonance imaging image that was reconstructed from the magnetic resonance data 1042.

The computer memory 1038 is shown as containing a control module 1050. The control module 1050 contains computer-executable code which enables the processor 1030 to control the operation and function of the magnetic resonance imaging system 1000. For instance the control module 1050 may contain computer code which enables the processor 1030 to use the pulse sequence data 1040 to control the magnetic resonance imaging system 1000 to acquire the magnetic resonance data 1042. The computer memory 1038 is further shown as containing an image reconstruction module 1052 which enables the processor 1030 to reconstruct the magnetic resonance image 1044 from the magnetic resonance data 1042. The contents of the computer storage 1036 and the computer memory 1038 may be identical or contents may be moved or shown in difference between the two. This is true for FIGS. 10, 11, and FIG. 12.

Figure 11:
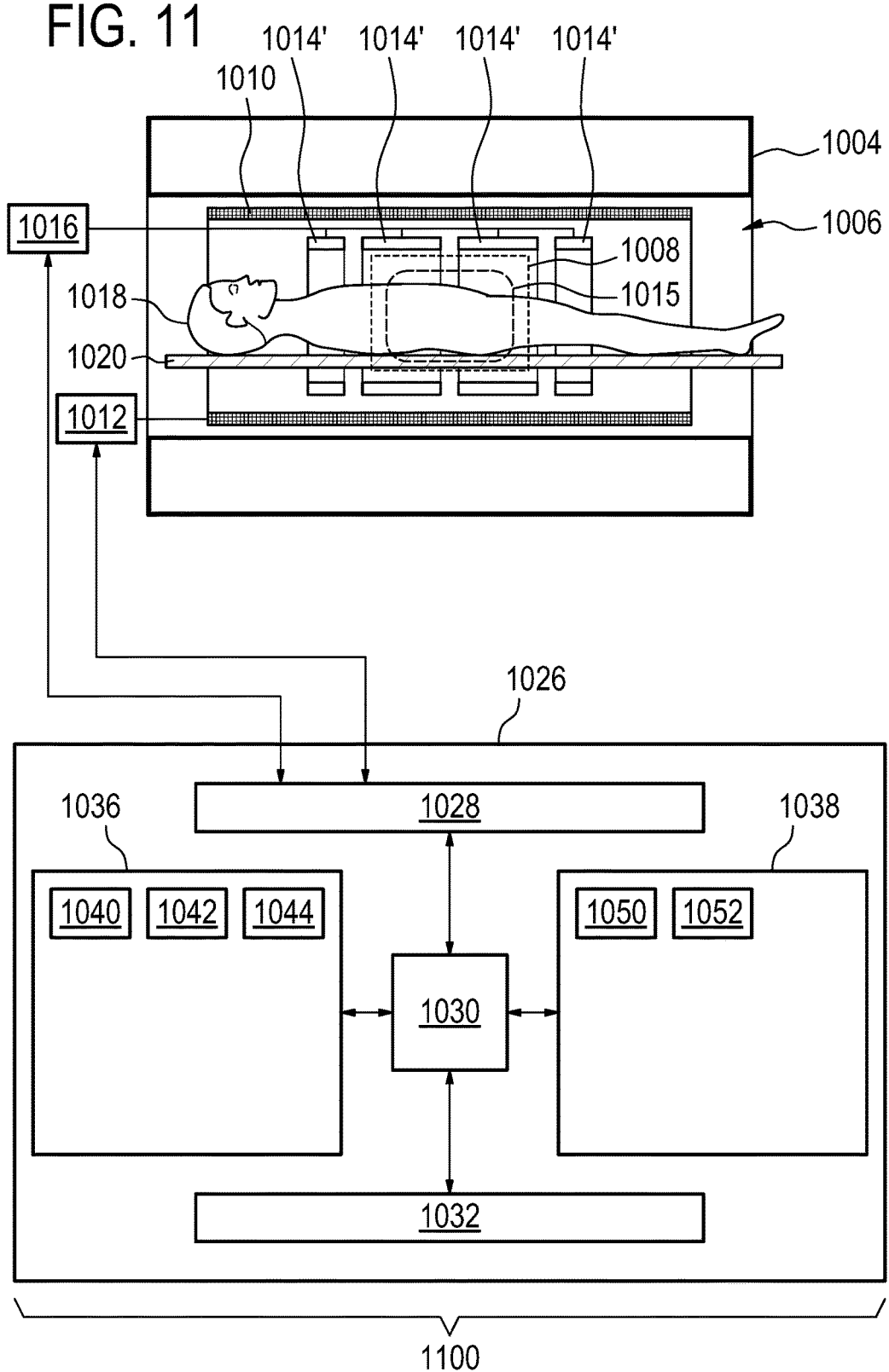
FIG. 11 illustrates a further example of a magnetic resonance imaging system.

FIG. 11 shows a magnetic resonance imaging system 1100 that is similar to that shown in FIG. 10. In this example, however, the radio-frequency antenna is made up from several different radio antenna elements 1014' that are split along the axis of symmetry of the magnet 1004. The antenna 1014' is essentially divided into segments along the z-direction. The transceiver 1016 is operable for providing each of the segments 1014' with individual radio-frequency pulses to each segment 1014'. In some examples, each segment may have 2 or more resonances which are fed by individual RF ports. There may be more amplifier channels than there are segments.

The pulse sequence data 1040 further contains data which enables the processor 1030 to control the transceiver 1016 to adjust the phase and power to each segment 1014' during the execution of the pulse sequence. The segments 1014' shown in FIG. 11 are intended to be representative and not drawn to scale. They are also intended to represent segmentation along the z-direction and also could be used to represent segmentation of the resonator about or around the z-direction such as is shown in FIGS. 4, 5, and 6.

Figure 12:
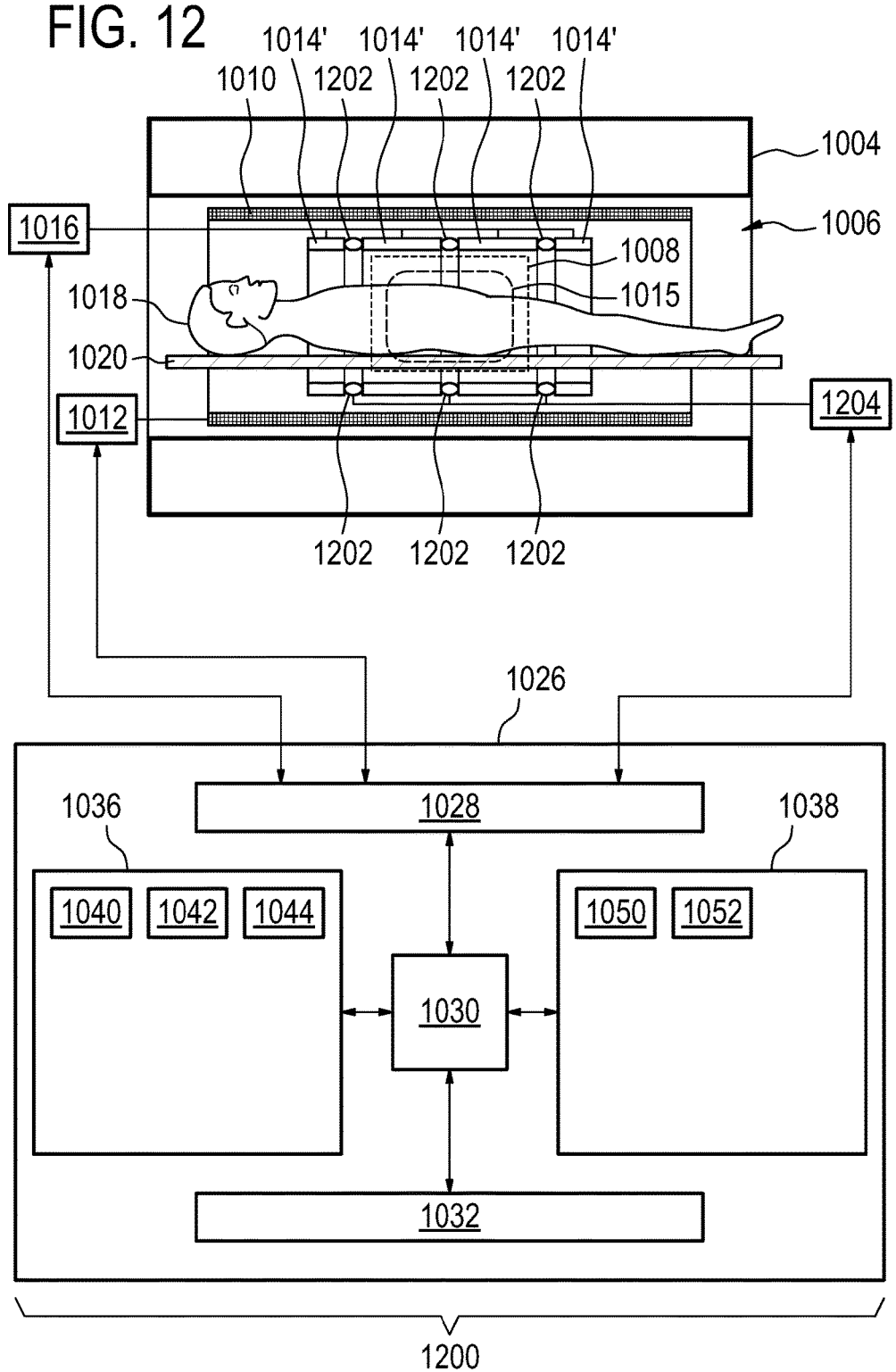
FIG. 12 illustrates a further example of a magnetic resonance imaging system.

FIG. 12 illustrates a further example of a magnetic resonance imaging system 1200. The magnetic resonance imaging system 1200 shown in FIG. 12 is similar to the magnetic resonance imaging system 1100 shown in FIG. 11. In FIG. 12 there are additional radio-frequency switches 1202 which connect the individual segments 1014' of the antenna. Each of the switches 1202 is controlled by a switch controller 1204. The switch controller 1204 is also connected to the hardware interface 1028 which enables the processor 1030 to control the switch controller 1204. In this example, the pulse sequence 1040 additionally controls commands which the processor 1030 uses to control the switch controller 1204 to modify the configuration of the radio-frequency antenna 1014' during the acquisition of the magnetic resonance data 1042. In addition to connecting segments 1014' of the antenna the radio-frequency switches 1202 could also be connected to a radio-frequency shield which is not shown in this Fig. The switches could be controlled independently and switches connected to the radio-frequency shield could be used for detuning the coil or even individual coil segments 1014'. The use of the switches 1202 between the individual segments 1014' enables the reconfiguration of the antenna on the fly during the acquisition of magnetic resonance data 1042.

Figure 13:
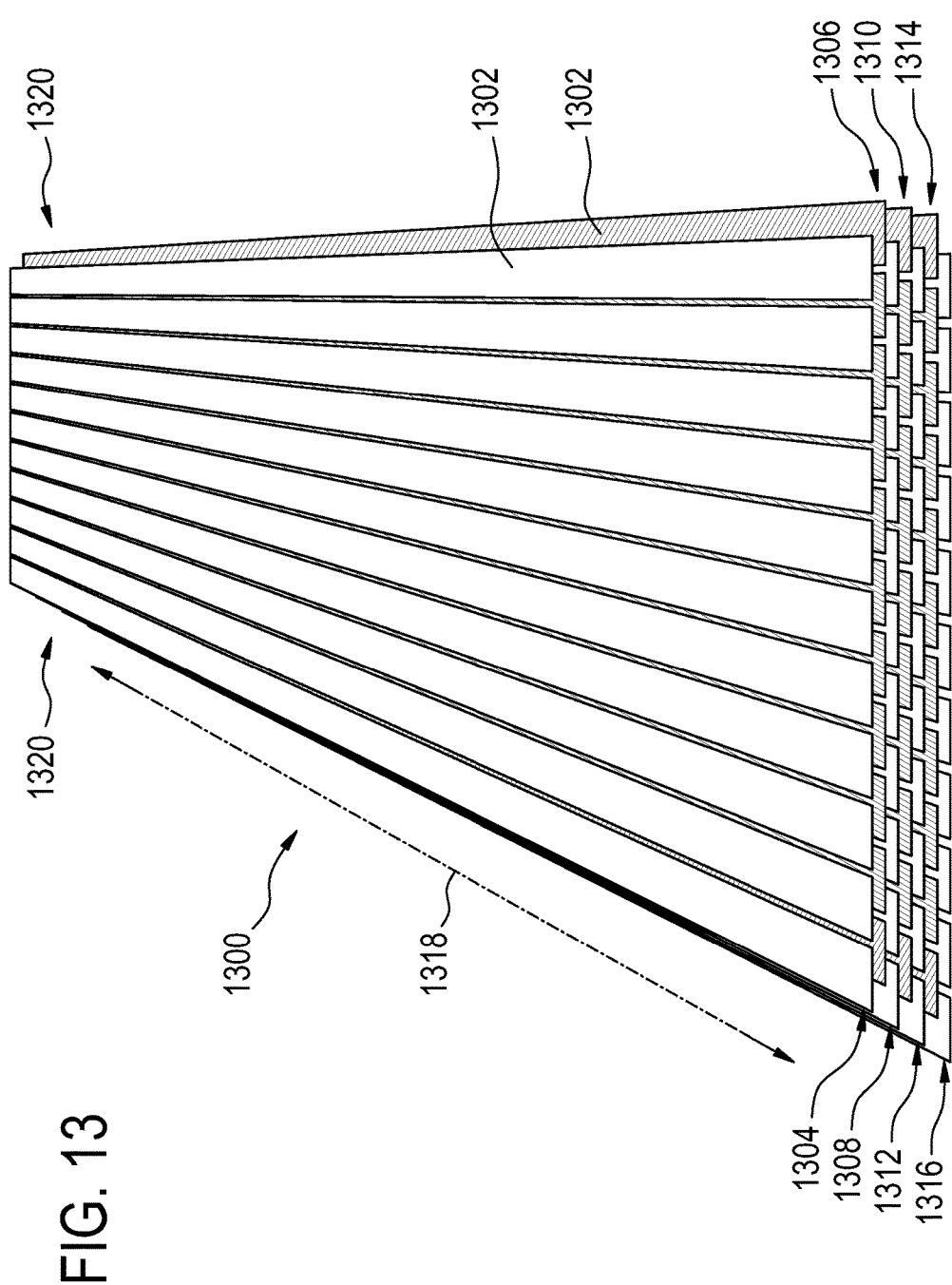
FIG. 13 illustrates an alternative design for a resonator for an antenna.

FIG. 13 shows an alternative design for a resonator for an antenna. In this example, conductive elements 1302 are arranged in a series of layers 1304, 1306, 1308, 1310, 1312, 1314, 1316. 7 layers are shown. The structure typically gets resonant in one or more modes, which are excited by separate RF generators or transmitters. The structure may also be separated or connected together in groups and powered. The various layers may be separated by a dielectric or electrically insulating layer. The resonator may be planar as is shown in FIG. 13. Alternatively the design in FIG. 13 may also be fashioned into a cylinder shape. The dashed line 1318 shows the direction of the z-axis. The seven layers may be wrapped about an axis parallel to 1318 such that the ends 1322 meet each other. This would form a tubular resonator that has a high conductivity in the z-direction. The z-direction aligned with the B0 field of the magnet of the magnetic resonance imaging system. In this figure the conductive elements 1302 function as both the electrical connections between the multiple capacitors and also form the multiple capacitors with conductive elements in adjacent layers. When formed into a cylinder the resonator could, for example, be used to replace a bird cage coil.

Figure 14:
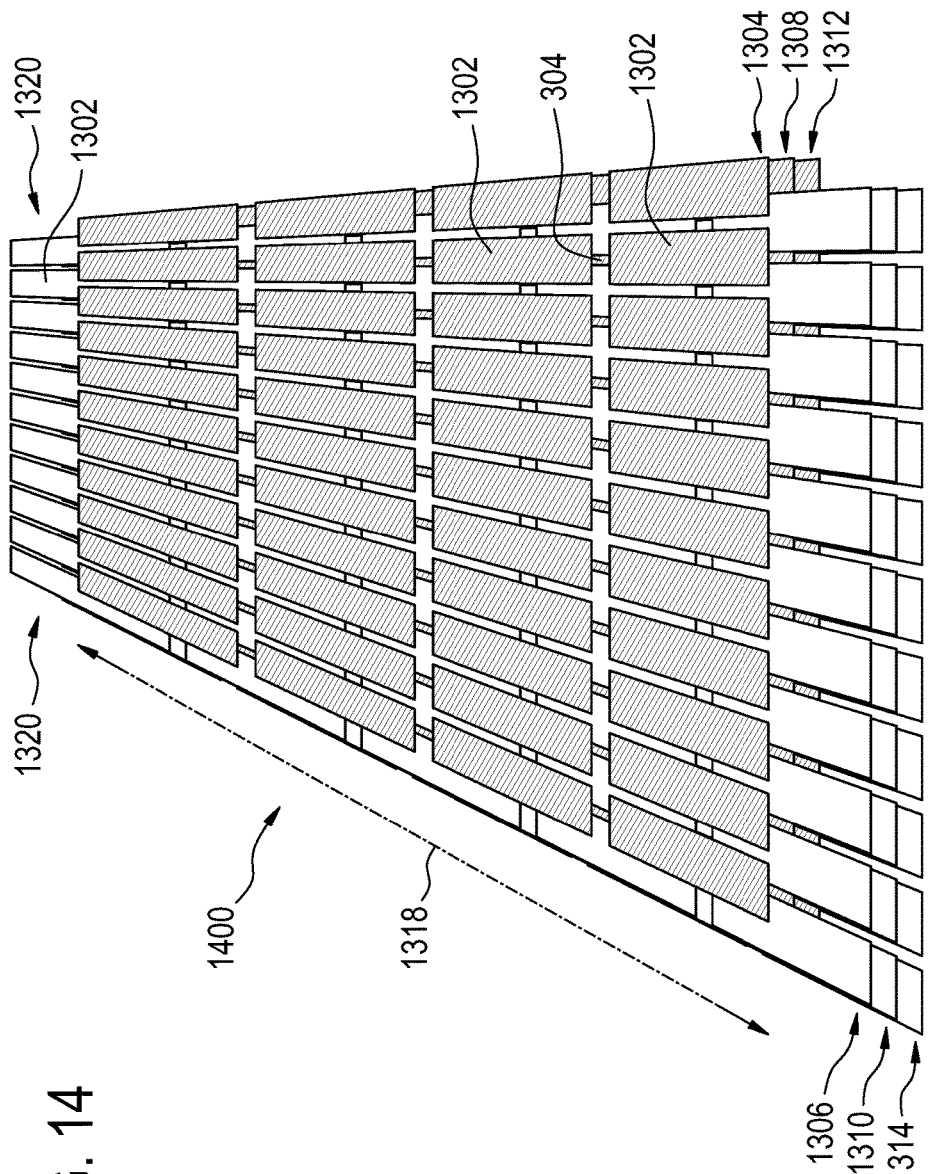
FIG. 14 illustrates a further alternative design for a resonator for an antenna.

FIG. 14 shows a further alternative construction for a resonator 1400 for an antenna. The resonator 1400 shown in FIG. 14 is similar to the resonator 1300 shown in FIG. 14. In this example, conductive elements 1302 are arranged in 6 layers. The conductive elements 1302 are divided into smaller segments along the axis 1318. The various layers 1304, 1308, 1310, 1312, 1314 may also be separated by a dielectric or electrically insulating layers. Like the resonator 1300, the resonator 1400 may be rolled up to form a tubular resonator.

Figure 15:
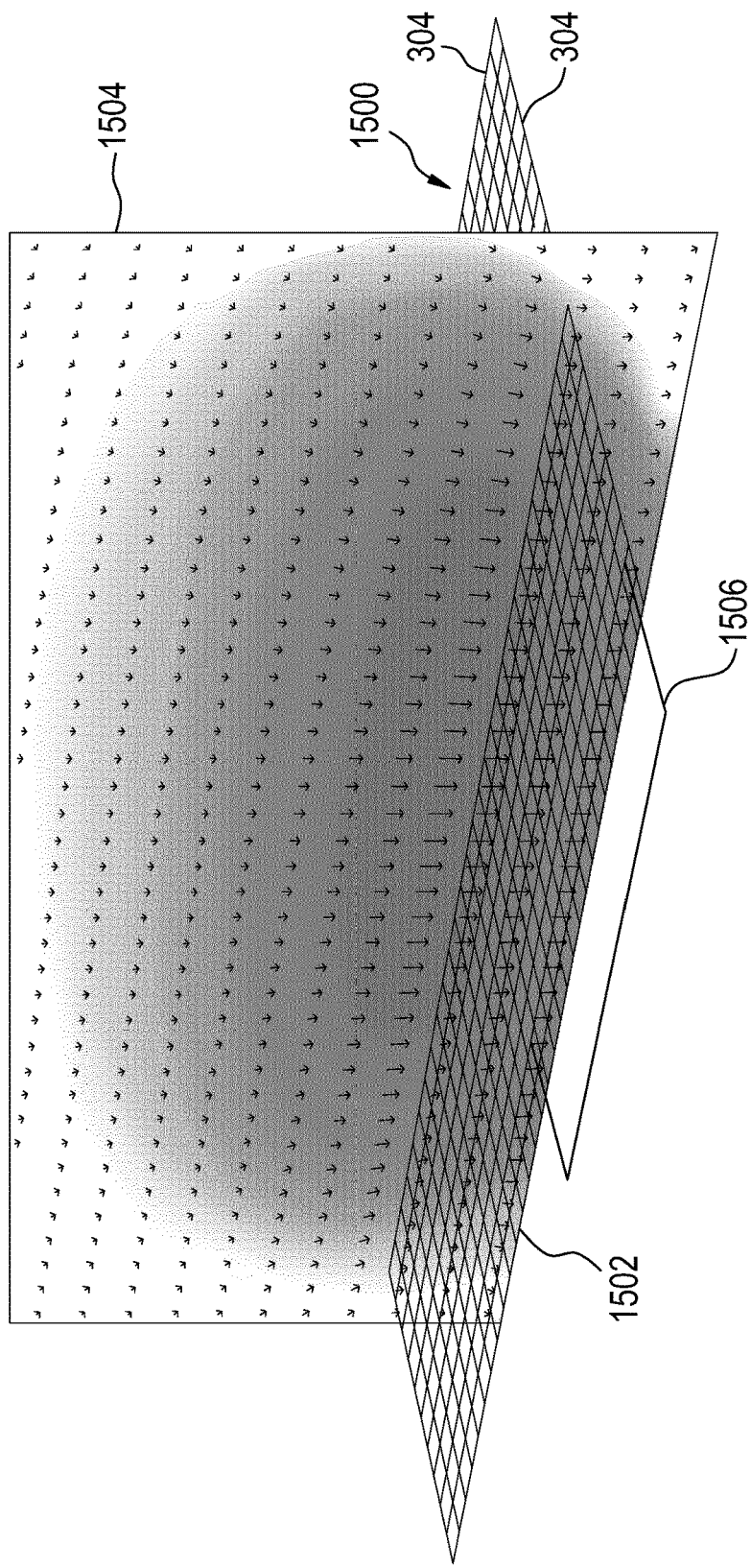
FIG. 15 illustrate results from simulating an RF antenna system with a planar resonator.
Figure 16:
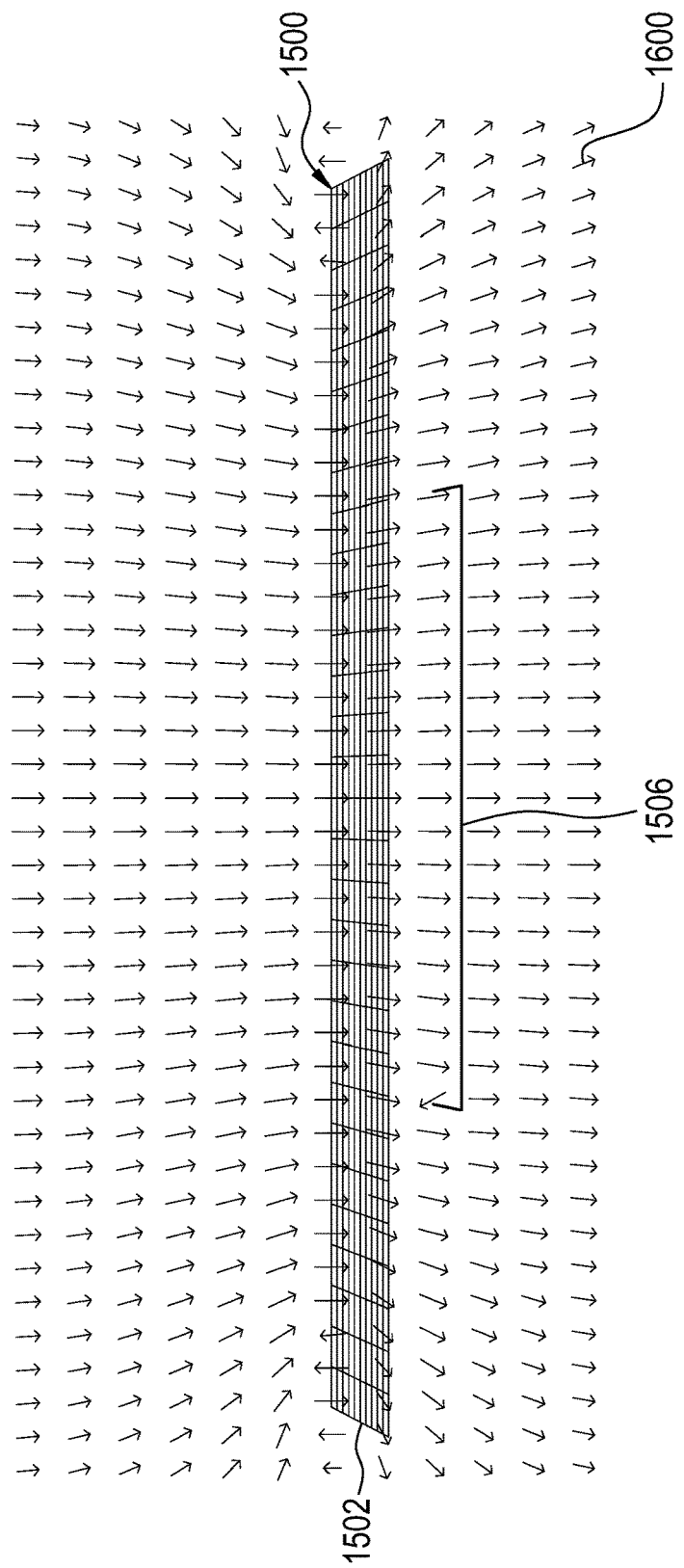
FIG. 16 further illustrates the simulation results displayed in FIG. 15.

FIG. 15 and FIG. 16 illustrate the results of simulating an RF antenna system with a planar resonator. In both figures an antenna 1500 with a planar resonator 1502 is shown. The planar resonator is 600 mm by 400 mm in size. The resonator is made from a grid of 31 by 21 conductors 304. The wires are modeled as having a 3 mm radius and 620 capacitances of approximately 5 pF each are located at the intersection of the rectangular grid formed by the conductors 340. During the modeling the antenna 1500 is fed using an inductively coupled rectangular coil 50 mm below the resonator 1502.

The resonator resonates at 127.728 MHz and has a magnetic field distribution useful for magnetic resonance imaging.

In FIG. 15 the magnetic field strength is shown as a grey scale in the plane 1504. The magnitude and direction of the magnetic field is also illustrated using vectors.

In FIG. 16 the vectors 1600 representing the magnetic field have a logarithmic scaling. FIG. 15 does not use logarithmic scaling. It can be seen, that the inductively coupled feeding coil 1506 does not significantly contribute to the RF field since the current is low compared to the sheet resonator.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 antenna
102 resonator
104 radio-frequency shield
106 electric current vectors on radio-frequency shield
200 distance [meter]
202 B1 Field [A/m]
300 periodic pattern
302 capacitor
304 conductor
306 triangular cell element
400 body coil
402 segment
404 conductor
406 connection point
408 connection point
500 body coil
502 segment
600 body coil
602 segment
604 conductor
606 capacitor
700 periodic pattern
800 periodic pattern
900 periodic pattern
1000 magnetic resonance imaging system
1004 magnet
1006 bore of magnet
1008 imaging zone
1010 magnetic field gradient coils
1012 magnetic field gradient coil power supply
1014 antenna
1014' antenna segments
1015 imaging volume
1016 transceiver
1018 subject
1020 subject support
1026 computer system
1028 hardware interface 1030 processor
1032 user interface
1036 computer storage
1038 computer memory
1040 pulse sequence data
1042 magnetic resonance data
1044 magnetic resonance image
1050 control module
1052 image reconstruction module
1100 magnetic resonance imaging system
1200 magnetic resonance imaging system
1202 radio-frequency switch
1204 switch controller
1300 resonator
1302 conductive element
1304 $1^{st}$ layer
1306 $2^{nd}$ layer
1308 $3^{rd}$ layer
1310 $4^{th}$ layer
1312 $5^{th}$ layer
1314 $6^{th}$ layer
1317 $7^{th}$ layer
1320 orientation of z-axis
1322 location
1400 resonator
1500 antenna
1502 resonator
1504 plane
1506 rectangular coil
1600 vector representing magnetic field.

The invention claimed is:

1. A radiofrequency (RF) antenna for transmitting RF excitation signals into and/or for receiving magnetic resonance (MR) signals from an MR imaging system's imaging volume, wherein the RF antenna comprises:
a coil former adjacent to the imaging volume; and
a resonator attached to the coil former and tuned to at least one resonant frequency formed from electrical connections, between multiple capacitors, wherein the multiple capacitors are distributed in a two-dimensional periodic pattern about and along the coil former, and wherein the periodic pattern of capacitors forms a structure that behaves as a two-dimensional dielectric conductor, wherein the two-dimensional periodic pattern extends in a longitudinal direction and a transverse direction with a first plurality of capacitors disposed in the longitudinal direction, and a second plurality of capacitors disposed in the transverse direction, the capacitors disposed in the longitudinal direction and the transverse direction being electrically interconnected.

2. The RF antenna of claim 1, wherein the coil former is formed from a dielectric, wherein the coil former comprises a first surface and a second surface, wherein each of the multiple capacitors is formed by a first conductive portion and a second conductive portion, wherein the first conductive portion is attached to the first surface, wherein the second conductive portion is attached to the second surface, wherein each capacitor is formed from a respective portion of the coil former with the first conductive portion and the second conductive portion.

3. The RF antenna of claim 2, wherein the RF antenna has an outer surface, wherein the wherein the RF antenna further comprises an RF shield adjacent to the outer surface.

4. The RF antenna of claim 3, further including multiple detuning radio-frequency switches connected between the RF shield and the resonator.

5. The RF antenna of claim 1 wherein the periodic pattern of capacitors has equal distances and equal capacitors in both directions of the two-dimensional dielectric conductor structure.

6. The RF antenna of claim 1, wherein the multiple capacitors have one or more nearest neighbors and nearest neighbors of the multiple capacitors are either one of electrically isolated or they are connected in series electrically.

7. The RF antenna of claim 1, wherein the periodic pattern is divided into electrically isolated groups, wherein each of the electrically isolated groups is electrically isolated from any other of the electrically isolated groups, and wherein each of the electrically isolated groups is configured to be connected to a separate radio-frequency channel.

8. The RF antenna of claim 7, wherein each of the electrically isolated groups is tuned to a single resonant frequency selected from multiple resonant frequencies.

9. The RF antenna of claim 8, wherein the RF antenna is configured as a surface coil comprising one or more antenna elements, wherein each of the antenna elements is one of the electrically isolated groups, and wherein the surface coil is adjacent to the imaging volume.

10. The RF antenna of claim 1, wherein the coil former is a cylinder, wherein the cylinder has an interior region which forms the imaging volume, wherein the cylinder has an axis of rotational symmetry, wherein the periodic pattern is segmented into electrically isolated groups along the axis of rotational symmetry.

11. The RF antenna of claim 1, wherein the coil former is a cylinder, wherein the cylinder has an interior region which forms the imaging volume, wherein the cylinder has an axis of symmetry, wherein the periodic pattern is segmented into electrically isolated groups about the axis of symmetry.

12. The RF antenna of claim 11, wherein the electrically isolated groups twist about the axis of symmetry.

13. The RF antenna of claim 11, wherein the electrically isolated groups comprise multiple radio-frequency switches arranged for connecting the electrically isolated groups electrically.

14. A magnetic resonance imaging system for acquiring magnetic resonance data from an imaging zone, wherein the imaging volume is within the imaging zone, wherein the magnetic resonance imaging system includes the RF antenna of claim 1.

15. The magnetic resonance imaging system of claim 14, wherein the periodic pattern is segmented into electrically isolated groups, and wherein the magnetic resonance imaging system further comprises:
a radio frequency system configured for separately supplying each of the electrically isolated groups with radio frequency power,
one or more processors configured for controlling the magnetic resonance imaging system,
a memory configured for storing machine executable instructions and pulse sequence data,
wherein execution of the machine executable instructions causes the one or more processors to control the magnetic resonance imaging system to acquire the magnetic resonance data according to the pulse sequence data,
wherein the pulse sequence data further comprises data configured for controlling the radio frequency system to adjust a phase and/or radio frequency power supplied to each of the plurality of electrically isolated groups during the acquisition of the magnetic resonance data.

16. A radiofrequency (RF) antenna for transmitting RF excitation signals into and/or for receiving magnetic resonance (MR) signals from an MR imaging system's imaging volume, wherein the RF antenna comprises:
  a coil former adjacent to the imaging volume; and
  a resonator attached to the coil former and tuned to at least one resonant frequency formed from electrical connections, between multiple capacitors, wherein the multiple capacitors are distributed in a two-dimensional periodic pattern about and along the coil former, and wherein the periodic pattern of capacitors forms a structure that behaves as a two-dimensional dielectric conductor,
  wherein the two-dimensional periodic pattern extends in a longitudinal direction and a transverse direction with a first plurality of capacitors disposed in the longitudinal direction, and a second plurality of capacitors disposed in the transverse direction, the capacitors disposed in the longitudinal direction and the transverse direction being electrically interconnected,
  wherein the two-dimensional pattern includes a plurality of cells disposed in the longitudinal direction and a plurality of cells disposed in the transverse direction, wherein the two-dimensional pattern includes one of:
    a two-dimensional grid of triangular cells,
    a two-dimensional grid of square cells, or
    a two-dimensional grid of hexagonal cells.

17. A radiofrequency (RF) antenna for transmitting RF excitation signals into and/or for receiving magnetic resonance (MR) signals from an MR imaging system's imaging volume, wherein the RF antenna comprises:
  a coil former adjacent to the imaging volume; and
  a resonator attached to the coil former and tuned to at least one resonant frequency formed from electrical connections, between multiple capacitors, wherein the multiple capacitors are distributed in a two-dimensional periodic pattern about and along the coil former, and wherein the periodic pattern of capacitors forms a structure that behaves as a two-dimensional dielectric conductor;
  wherein the coil former is a cylinder, an interior region of the cylinder defining an imaging volume and wherein a plurality of resonator segments extend longitudinally along the coil former cylinder at circumferentially spaced intervals, each of the resonator segments includes a two-dimensional periodic pattern of capacitors defined by a plurality of capacitor cells arranged in a grid, the grid including a plurality of the capacitor cells in both a longitudinal direction and a circumferential direction.

18. A radio frequency (RF) antenna for transmitting RF excitation signals into and/or for receiving magnetic resonance (MR) signals from an MR imaging system's imaging volume, wherein the RF antenna comprises:
  a coil former adjacent to the imaging volume; and
  a resonator attached to the coil former and tuned to at least one resonant frequency formed from electrical connections, between multiple capacitors, wherein the multiple capacitors are distributed in a two-dimensional periodic pattern about and along the coil former, and wherein the periodic pattern of capacitors forms a structure that behaves as a two-dimensional dielectric conductor,
  wherein the resonator includes a plurality of layers, each layer including a plurality of longitudinally elongated conductive strips disposed parallel to each other separated by longitudinally extending gaps, the layers of longitudinally conductive strips being separated from each other by electrically insulating layers, the longitudinally elongated conductive strips of each layer being offset transversely such that each longitudinally elongated conductive strip capacitively couples to two longitudinally conductive strips of an adjacent layer of longitudinally elongated conductive strips.

* * * * *